(12) United States Patent
Liu et al.

(10) Patent No.: US 11,357,145 B2
(45) Date of Patent: Jun. 7, 2022

(54) PICKING APPARATUS CAPABLE OF PICKING UP TARGET MICRO-ELEMENTS

(71) Applicant: Lextar Electronics Corporation, Hsinchu (TW)

(72) Inventors: Chi-Wei Liu, Hsinchu (TW); Fu-Hsin Chen, Hsinchu (TW); Yu-Chun Lee, Hsinchu (TW)

(73) Assignee: Lextar Electronics Corporation, Hsinchu (TW)

( * ) Notice: Subject to any disclaimer, the term of this patent is extended or adjusted under 35 U.S.C. 154(b) by 291 days.

(21) Appl. No.: 16/693,399

(22) Filed: Nov. 25, 2019

(65) Prior Publication Data
US 2021/0120711 A1    Apr. 22, 2021

(30) Foreign Application Priority Data
Oct. 21, 2019   (TW) .................................. 108137937

(51) Int. Cl.
*B25J 15/00*    (2006.01)
*B25J 15/04*    (2006.01)
*H05K 13/04*    (2006.01)

(52) U.S. Cl.
CPC ........ *H05K 13/0404* (2013.01); *B25J 15/008* (2013.01); *B25J 15/0408* (2013.01)

(58) Field of Classification Search
CPC .. H05K 13/0404; B25J 15/0408; B25J 15/008
USPC ...................................................... 294/212
See application file for complete search history.

(56) References Cited

U.S. PATENT DOCUMENTS

| | | | | |
|---|---|---|---|---|
| 5,470,116 A | * | 11/1995 | DeWoskin | A47J 45/00 294/212 |
| 2005/0161961 A1 | * | 7/2005 | Ruff | B25F 1/02 294/212 |
| 2006/0159909 A1 | * | 7/2006 | Aslan | C09D 7/61 428/323 |
| 2006/0209379 A1 | * | 9/2006 | Guscho | G02F 1/292 359/245 |
| 2010/0018420 A1 | | 1/2010 | Menard | |
| 2015/0295206 A1 | * | 10/2015 | Hsieh | H01L 51/56 294/212 |
| 2018/0197767 A1 | * | 7/2018 | Yue | H05K 13/0404 |
| 2019/0048231 A1 | * | 2/2019 | Bernt | B29C 33/68 |
| 2019/0067237 A1 | * | 2/2019 | Kitazawa | H05K 13/04 |

(Continued)

FOREIGN PATENT DOCUMENTS

| | | |
|---|---|---|
| CN | 106903978 B | 1/2019 |
| CN | 107154374 B | 9/2019 |
| JP | 2010-168079 A | 8/2010 |

(Continued)

*Primary Examiner* — Paul T Chin
(74) *Attorney, Agent, or Firm* — CKC & Partners Co., LLC

(57) ABSTRACT

A picking apparatus is configured to pick up a plurality of micro elements. The picking apparatus includes a main body and a plurality of picking portions. The picking portions connect with and protrude from the main body. Each of the picking portions has a first surface. The first surfaces are away from the main body and configured to pick up the micro elements. The main body has a second surface at least partially located between the picking portions. Each of the first surfaces has a first viscosity. The second surface has a second viscosity. The second viscosity is less than the first viscosity.

10 Claims, 2 Drawing Sheets

(56) References Cited

U.S. PATENT DOCUMENTS

2019/0273009 A1* 9/2019 Koyanagi ............ H01L 21/7806
2020/0153001 A1* 5/2020 Keite-Telgenbuscher ...................
                                                H01M 8/0284

FOREIGN PATENT DOCUMENTS

| TW | 201005219 A | 2/2010 |
| TW | 201604621 A | 2/2016 |
| TW | 201614860 A | 4/2016 |
| TW | 201916227 A | 4/2019 |
| TW | 201939665 A | 10/2019 |

* cited by examiner

PICKING APPARATUS CAPABLE OF PICKING UP TARGET MICRO-ELEMENTS

RELATED APPLICATIONS

This application claims priority to Taiwanese Application Serial Number 108137937, filed Oct. 21, 2019, which is herein incorporated by reference.

BACKGROUND

Technical Field

The present disclosure relates to a picking apparatus. More particularly, the present disclosure relates to a picking apparatus for picking micro elements.

Description of Related Art

With the advancement of technology, electronic products have been largely integrated into the lives of consumers. In order to meet the needs of consumers, apart from the continuous improvement of the performance of electronic products, electronic products are becoming more light-weight in design.

However, in the production process of the electronic products, how to effectively handle and transfer a large amount of components with decreasing volumes and weights is undoubtedly an important issue for the development of the industry.

SUMMARY

A technical aspect of the present disclosure is to provide a picking apparatus, which can effectively increase the yield of transferring the micro elements and the utilization rate of the micro elements.

According to an embodiment of the present disclosure, a picking apparatus is configured to pick up a plurality of micro elements. The picking apparatus includes a main body and a plurality of picking portions. The picking portions connect with and protrude from the main body. Each of the picking portions has a first surface. The first surfaces are away from the main body and configured to pick up the micro elements. The main body has a second surface at least partially located between the picking portions. Each of the first surfaces has a first viscosity. The second surface has a second viscosity. The second viscosity is less than the first viscosity.

In one or more embodiments of the present disclosure, the second viscosity is less than about 2 g/mm$^2$.

In one or more embodiments of the present disclosure, the first viscosity is larger than about 10 g/mm$^2$.

In one or more embodiments of the present disclosure, the main body includes a subsidiary main body and an anti-adhesion layer. The picking portions connect with and protrude from the subsidiary main body. The anti-adhesion layer connects with the subsidiary main body and is at least partially located between the picking portions. The second surface is located on a side of the anti-adhesion layer away from the subsidiary main body. The first surfaces are farther away from the subsidiary main body than the second surface.

In one or more embodiments of the present disclosure, the anti-adhesion layer includes organic material containing fluorine.

In one or more embodiments of the present disclosure, the anti-adhesion layer includes organic silicon.

In one or more embodiments of the present disclosure, the anti-adhesion layer comprises boron nitride.

In one or more embodiments of the present disclosure, the anti-adhesion layer is metallic coating.

In one or more embodiments of the present disclosure, the main body includes elastic material.

In one or more embodiments of the present disclosure, the picking apparatus further includes a substrate. The substrate connects on a side of the main body away from the picking portions.

When compared with the prior art, the above-mentioned embodiments of the present disclosure have at least the following advantage: when the picking apparatus approaches the carrier substrate, even if the condition of the contact of the second surface of the main body to the micro elements is happened due to the deformation of the main body or the deformation of the picking portions which are over compressed, since the second viscosity of the second surface is less than the first viscosity of the first surface, the second surface of the main body is not able to adhere the micro elements and move them away from the carrier substrate. In this way, the picking apparatus is able to effectively increase the transfer yield of the micro elements and the utilization rate of the micro elements.

BRIEF DESCRIPTION OF THE DRAWINGS

The disclosure can be more fully understood by reading the following detailed description of the embodiments, with reference made to the accompanying drawings as follows.

DETAILED DESCRIPTION

Figure 1:
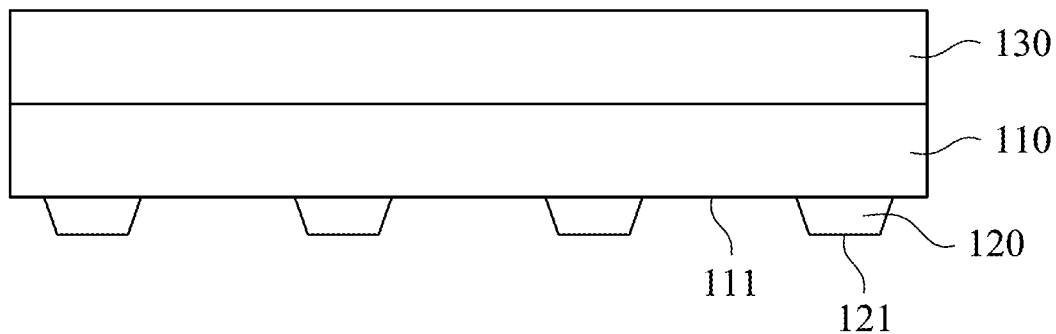
FIG. 1 is a side view of a picking apparatus according to an embodiment of the present disclosure.

Drawings will be used below to disclose embodiments of the present disclosure. For the sake of clear illustration, many practical details will be explained together in the description below. However, it is appreciated that the practical details should not be used to limit the claimed scope. In other words, in some embodiments of the present disclosure, the practical details are not essential. Moreover, for the sake of drawing simplification, some customary structures and elements in the drawings will be schematically shown in a simplified way. Wherever possible, the same reference numbers are used in the drawings and the description to refer to the same or like parts.

Unless otherwise defined, all terms (including technical and scientific terms) used herein have the same meanings as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Reference is made to FIG. 1. FIG. 1 is a side view of a picking apparatus 100 according to an embodiment of the present disclosure. In this embodiment, the present disclosure provides a picking apparatus 100 configured to pick up a plurality of micro elements 200 (please see FIG. 2). As shown in FIG. 1, the picking apparatus 100 includes a main body 110 and a plurality of picking portions 120. The main body 110 can be of elastomer of polymer material, such as elastic polymer material. For example, the main body 110 can be of polyoxyalkylene material, such as polydimethylsiloxane (PDMS). The picking portions 120 connect with the main body 110 and protrude from the main body 110. The picking portions 120 and the main body 110 are of the same material. Each of the picking portions 120 has a first surface 121, in which the first surfaces 121 are away from the main body 110 and configured to pick up the micro elements 200. The way of picking will be described below. On the other hand, the main body 110 has a second surface 111. The second surface 111 of the main body 110 is at least partially located between the picking portions 120. The first surface 121 of each of the picking portions 120 has a first viscosity, and the second surface 111 of the main body 110 has a second viscosity. It is worth to note that, the second viscosity of the second surface 111 is less than the first viscosity of the first surfaces 121. In other words, the first surface 121 of each of the picking portions 120 has a stronger adhesive force than the second surface 111 of the main body 110. In practical applications, the micro elements 200 can be micro light emitting diodes (micro-LEDs). However, this does not intend to limit the present disclosure.

On the other hand, in the structural point of view, the picking apparatus 100 further includes a substrate 130. The substrate 130 connects on a side of the main body 110 away from the picking portions 120. In other words, the main body 110 is located between the substrate 130 and the picking portions 120. According to the actual situation, the substrate 130 can be of a transparent material or an opaque material.

Figure 2:
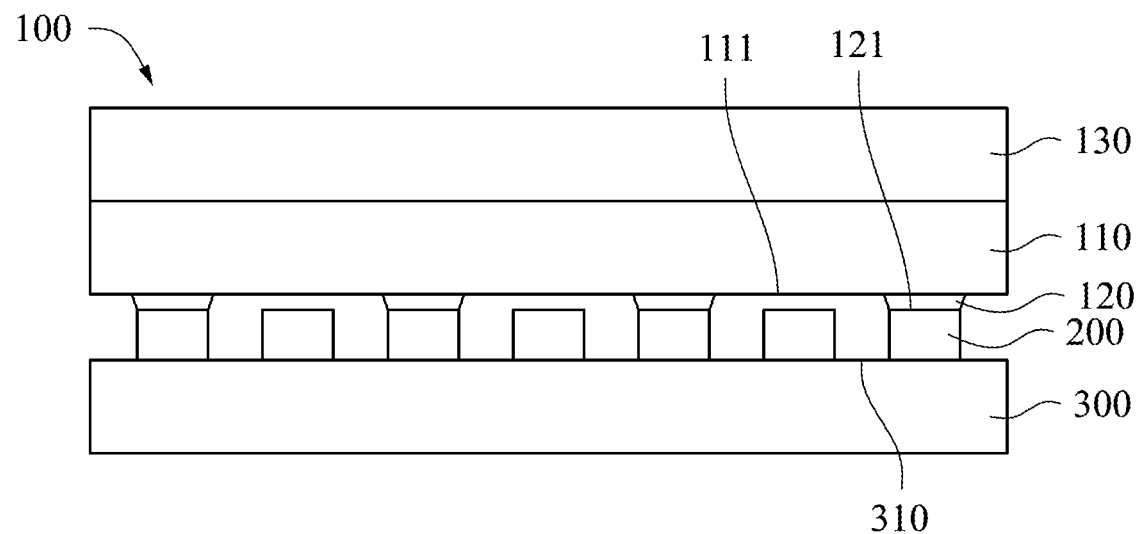
FIG. 2 is a side view of the picking apparatus of FIG. 1, in which the picking portions pick up the micro elements.

Reference is made to FIG. 2. FIG. 2 is a side view of the picking apparatus 100 of FIG. 1, in which the picking portions 120 pick up the micro elements 200. In this embodiment, as shown in FIG. 2, the micro elements 200 are originally located on a carrier substrate 300. The carrier substrate 300 is used for carrying the micro elements 200 to facilitate the subsequent working procedures. In an embodiment, the carrier substrate 300 can be a source substrate of the micro elements 200. A third surface 310 of the carrier substrate 300 has a third viscosity in order to hold the micro elements 200 on the third surface 310 of the carrier substrate 300.

When the picking apparatus 100 approaches the carrier substrate 300, the picking portions 120 of the picking apparatus 100 contact the micro elements 200. To be specific, it is the first surface 121 of each of the picking portions 120 which contacts the micro elements 200 and carries out the adhesion to the micro elements 200. In order to enable the picking apparatus 100 to move the micro elements 200 from the carrier substrate 300 and transfer to the next working point, the first viscosity of the first surfaces 121 is substantially larger than the third viscosity of the third surface 310. Therefore, when the picking apparatus 100 adheres the micro elements 200 and leaves together, the micro elements 200 will adhere to the picking portions 120 and leave with the picking apparatus 100, and will not be adhered by the third surface 310 of the carrier substrate 300 to remain staying on the carrier substrate 300.

For example, in this embodiment, the first viscosity of the first surfaces 121 is larger than about 10 g/mm², while the third viscosity of the third surface 310 of the carrier substrate 300 is less than about 10 g/mm². However, it should be noted that the first viscosity of the first surfaces 121 as cited herein is only illustrative and is not to limit the claimed scope. A person having ordinary skill in the art of the present disclosure may appropriately establish the first viscosity of the first surfaces 121 according to the actual needs.

When the picking apparatus 100 approaches the carrier substrate 300, even if the condition of the contact of the second surface 111 of the main body 110 to the micro elements 200 is happened due to the deformation of the main body 110 or the deformation of the picking portions 120 which are over compressed, as mentioned above, since the second viscosity of the second surface 111 is less than the third viscosity of the third surface 310, and is also less than the first viscosity of the first surface 121, the second surface 111 of the main body 110 is not able to adhere the micro elements 200 and move them away from the carrier substrate 300. In this way, the picking apparatus 100 is able to effectively increase the yield of transferring the micro elements 200 and the utilization rate of the micro elements 200.

To be specific, in this embodiment, the second viscosity of the second surface 111 is less than about 2 g/mm², and the third viscosity of the third surface 310 of the carrier substrate 300 is practically larger than about 2 g/mm². However, it should be noted that the second viscosity of the second surface 111 as cited herein is only illustrative and is not to limit the claimed scope. A person having ordinary skill in the art of the present disclosure may appropriately establish the second viscosity of the second surface 111 according to the actual needs.

In conclusion, in practical applications, the first surface 121 of each of the picking portions 120 has a stronger adhesive force than the third surface 310 of the carrier substrate 300, and the third surface 310 of the carrier substrate 300 has a stronger adhesive force than the second surface 111 of the main body 110, such that the micro elements 200 can be adhered and moved away by the first surfaces 121 of the picking portions 120, and cannot be adhered and moved away by the second surface 111 of the main body 110.

For example, in order to decrease the second viscosity of the second surface 111, users can carry out surface treatment to the second surface 111 of the main body 110 using method such as plasma bombardment, to make the second viscosity of the second surface 111 to be less than about 2 g/mm². However, it should be noted that using plasma bombardment as the surface treatment method as cited herein is only illustrative and is not to limit the claimed scope. A person having ordinary skill in the art of the present disclosure may appropriately choose the surface treatment method of the second surface 111 according to the actual needs.

Figure 3:
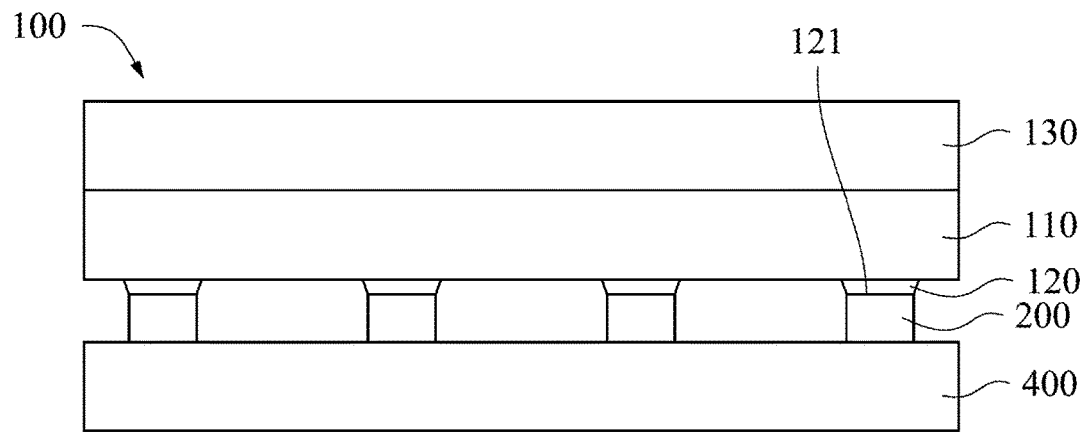
FIG. 3 is a side view of the picking apparatus of FIG. 1, in which the picking apparatus puts the micro elements on a receiving substrate.

Reference is made to FIG. 3. FIG. 3 is a side view of the picking apparatus 100 of FIG. 1, in which the picking apparatus 100 puts the micro elements 200 on a receiving substrate 400. In practical applications, as shown in FIG. 3, the receiving substrate 400 can be a temporary substrate or a circuit substrate. However, this does not intend to limit the present disclosure. When the micro elements 200 contact the receiving substrate 400, users can use methods such as adhesion or welding to fix the micro elements 200 on the receiving substrate 400.

In order to enable the picking apparatus 100 to put the micro elements 200 on the receiving substrate 400, the force that the receiving substrate 400 fixes the micro elements 200 is substantially larger than the first viscosity of the first surface 121. Therefore, when the picking apparatus 100 makes the micro elements 200 to be fixed on the receiving substrate 400 and leaves, the micro elements 200 will be fixed on the receiving substrate 400, and will not adhere to the picking portions 120 and leave from the receiving substrate 400 with the picking apparatus 100.

Figure 4:
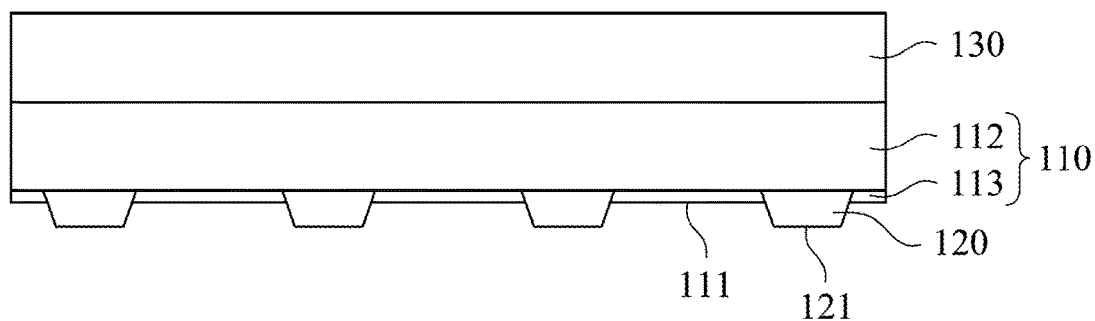
FIG. 4 is a side view of a picking apparatus according to another embodiment of the present disclosure.

Reference is made to FIG. 4. FIG. 4 is a side view of a picking apparatus 100 according to another embodiment of the present disclosure. In this embodiment, as shown in FIG. 4, the main body 110 includes a subsidiary main body 112 and an anti-adhesion layer 113. The picking portions 120 connect with and protrude from the subsidiary main body 112. The anti-adhesion layer 113 connects with the subsidiary main body 112 and is at least partially located between the picking portions 120. The second surface 111 is located on a side of the anti-adhesion layer 113 away from the subsidiary main body 112. The first surfaces 121 of the picking portions 120 are farther away from the subsidiary main body 112 than the second surface 111.

In practical applications, the anti-adhesion layer 113 of the main body 110 can be formed from methods such as spray coating, evaporation, sputtering, chemical vapor deposition, and the anti-adhesion layer 113 can include organic material containing fluorine, organic silicon, boron nitride, etc. According to the actual situation, the anti-adhesion layer 113 of the main body 110 is metallic coating. The type of metal can be aluminum, titanium, copper, gold, silver, chromium, nickel, cobalt, zinc, etc. However, this does not intend to limit the present disclosure.

In conclusion, when compared with the prior art, the aforementioned embodiments of the present disclosure have at least the following advantage: when the picking apparatus approaches the carrier substrate, even if the condition of the contact of the second surface of the main body to the micro elements is happened due to the deformation of the main body or the deformation of the picking portions which are over compressed, since the second viscosity of the second surface is less than the first viscosity of the first surface, the second surface of the main body is not able to adhere the micro elements and move them away from the carrier substrate. In this way, the picking apparatus is able to effectively increase the transfer yield of the micro elements and the utilization rate of the micro elements.

Although the present disclosure has been described in considerable detail with reference to certain embodiments thereof, other embodiments are possible. Therefore, the spirit and scope of the appended claims should not be limited to the description of the embodiments contained herein.

It will be apparent to the person having ordinary skill in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:

1. A picking apparatus, configured to pick up a plurality of micro elements which are disposed on a third surface of a carrier substrate, the picking apparatus comprising:
    a main body; and
    a plurality of picking portions connected with and protruding from the main body, each of the picking portions having a first surface, the first surfaces being away from the main body and configured to pick up the micro elements, the main body having a second surface at least partially located between the picking portions,
    wherein each of the first surfaces has a first viscosity, the second surface has a second viscosity, the third surface has a third viscosity, the first viscosity is substantially larger than the third viscosity, the second viscosity is less than the first viscosity and the third viscosity.

2. The picking apparatus of claim 1, wherein the second viscosity is less than about 2 g/mm$^2$.

3. The picking apparatus of claim 1, wherein the first viscosity is larger than about 10 g/mm$^2$.

4. The picking apparatus of claim 1, wherein the main body comprises:
    a subsidiary main body, the picking portions connect with and protrude from the subsidiary main body; and
    an anti-adhesion layer connected with the subsidiary main body and at least partially located between the picking portions, the second surface located on a side of the anti-adhesion layer away from the subsidiary main body, the first surfaces are farther away from the subsidiary main body than the second surface.

5. The picking apparatus of claim 4, wherein the anti-adhesion layer comprises organic material containing fluorine.

6. The picking apparatus of claim 4, wherein the anti-adhesion layer comprises organic silicon.

7. The picking apparatus of claim 4, wherein the anti-adhesion layer comprises boron nitride.

8. The picking apparatus of claim 4, wherein the anti-adhesion layer is metallic coating.

9. The picking apparatus of claim 1, wherein the main body comprises elastic material.

10. The picking apparatus of claim 1, further comprising a substrate connected on a side of the main body away from the picking portions.

* * * * *